US006620574B2

(12) United States Patent
Campbell et al.

(10) Patent No.: US 6,620,574 B2
(45) Date of Patent: Sep. 16, 2003

(54) METHOD OF TREATING PHOTORESISTS USING ELECTRODELESS UV LAMPS

(75) Inventors: Randal L. Campbell, New Alexandria, PA (US); James E. Jones, Butler, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 65 days.

(21) Appl. No.: 09/951,582

(22) Filed: Sep. 12, 2001

(65) Prior Publication Data

US 2003/0129537 A1 Jul. 10, 2003

(51) Int. Cl.[7] .................................................. G03F 7/20
(52) U.S. Cl. ....................................... 430/311; 430/322
(58) Field of Search .............................. 430/311, 313, 430/322, 325, 328

(56) References Cited

U.S. PATENT DOCUMENTS

| 4,532,427 A | * | 7/1985 | Matthews ................ 250/492.2 |
| 4,841,342 A | | 6/1989 | Suzuki et al. .................. 355/71 |
| 4,882,263 A | * | 11/1989 | Suzuki ........................ 430/328 |
| 5,504,391 A | * | 4/1996 | Turner ........................ 313/570 |
| 5,686,793 A | * | 11/1997 | Turner ........................ 313/570 |
| 5,726,815 A | | 3/1998 | Gunter et al. ................ 359/872 |
| 5,832,362 A | | 11/1998 | Trokhan .................. 422/186.3 |
| 5,962,860 A | | 10/1999 | Trokhan et al. ......... 250/504 R |
| 6,118,130 A | | 9/2000 | Barry ..................... 250/504 R |
| 6,246,160 B1 | | 6/2001 | MacLennan et al. ........ 313/113 |

OTHER PUBLICATIONS

The System of Choice, "UV Curing from Fusion UV–Tomorrow's Technology Today", by Fusion UV Systems, Inc., dated 6/98.

* cited by examiner

Primary Examiner—Kathleen Duda
(74) Attorney, Agent, or Firm—Diane R. Meyers

(57) ABSTRACT

Methods for treating a photoresist by exposure to light from an electrodeless UV bulb are disclosed. The methods are applicable to both positive and negative photoresists. In the case of positive photoresists, use of electrodeless UV lamps significantly reduces the UV exposure time. Methods for making circuit boards and apparatus for making circuit boards are also disclosed.

14 Claims, 1 Drawing Sheet

US 6,620,574 B2

METHOD OF TREATING PHOTORESISTS USING ELECTRODELESS UV LAMPS

FIELD OF THE INVENTION

The present invention relates to methods and apparatus for treating photoresist materials using electrodeless UV lamps. The present invention finds particular application in the preparation of circuit boards.

BACKGROUND INFORMATION

Processes for forming resist patterns on the surfaces of substrates typically comprise forming a photo-sensitive layer on the surface of the substrate, irradiating portions of the photo-sensitive layer with actinic light, and developing the irradiated layer. If the solubilization of the photoresist increases when exposed to actinic light, it is referred to as a "positive-acting" photoresist; the relatively high molecular weight positive-acting photoresist material depolymerizes, or undergoes breakage of the polymer bonds, upon exposure to actinic radiation thereby rendering the treated compound easily dissolved by developing solution. If the solubilization of the photoresist decreases when exposed to actinic radiation, it is referred to as a "negative-acting" photoresist; the relatively low molecular weight negative-acting material crosslinks upon exposure to actinic radiation and, thus, it is the non-treated compound that dissolves upon exposure to the developing solution.

Photoresists are often used to protect the underlying substrate from the effects of a subsequent etching process. Defects in the resist pattern, such as inadequate coverage over certain parts of the substrate or inadequate development of the irradiated layer, can result in problems in the completed product. Accordingly, it is important to employ a photoresist whose irradiated layer can adequately be developed and that forms a uniform layer over all surfaces of the substrate to be protected.

Photoreactive polymers are particularly useful as binder resins in photoresist compositions employed in photodevelopment of electronic components such as circuit boards and other products. Positive-acting resists are often preferred in the manufacture of circuit boards; defects that will occur in the manufacture of circuit boards are easier to repair when positive-acting resists are used as compared to when negative-active resists are used. The irradiation of the photoresist, in the case of circuit board manufacture, often occurs through a glass or plastic cover sheet. The use of "masks" or "art work" prevents exposure of desired areas of the photoresist to UV light.

SUMMARY OF THE INVENTION

The present invention is directed to the use of electrodeless UV lamps to effect treating of photoresist compositions. Both positive and negative photoresists can be treated according to the present invention. A positive resist, as discussed above, is a relatively high molecular weight composition, such as a polymer, that depolymerizes upon exposure to UV light. The polymer bonds break thereby reducing the overall molecular weight of the composition. The positive photoresist composition that is exposed to UV light is therefore more easily dissolved by a developing solution. In this manner, the portion of the composition that has been exposed to UV light is removed. Negative photoresists, in contrast, are relatively low molecular weight compositions that crosslink upon exposure to UV light to form high molecular weight polymers. The material that is not crosslinked, i.e. that which is not exposed to UV light, is removed during the developing step.

The present methods find particular application in the preparation of electronic circuit boards. To this end, the present invention is further directed to apparatus and methods for making a circuit board. While the present invention is directed to the treatment of both positive and negative photoresists, positive-acting photoresists are often preferred in the manufacture of circuit boards. The surface characteristics of positive photoresists are often superior to negative photoresists, with fewer mechanical defects. In addition, positive-acting photoresists often handle better than their negative counterparts. The energy needed to break bonds in the case of positive photoresists is typically much higher than the energy needed to form bonds, or promote crosslinking in the case of negative photoresists; this increased energy requirement typically necessitates a longer exposure time to the light source. This can result in a much longer manufacturing time per piece, particularly when using automated systems. Thus, notwithstanding the benefits achieved with a positive photoresist, because of the extended exposure time mass production of circuit boards and other products often favors the use of negative photoresists. The present invention addresses this issue. Because electrodeless UV lamps operate at a higher intensity, their use may significantly reduce the amount of UV exposure time for treating positive photoresists.

DETAILED DESCRIPTION OF THE INVENTION

Figure 1:
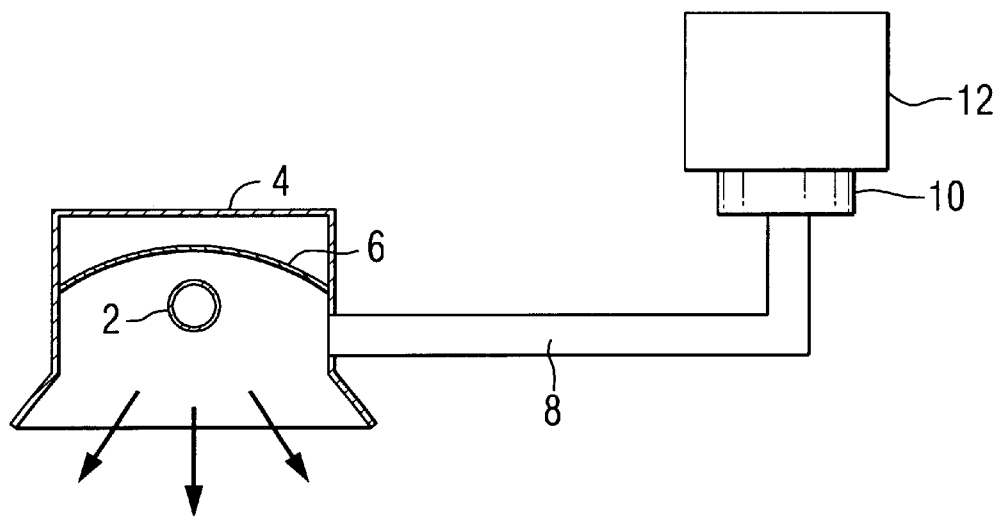
FIG. 1 is a partially cross-sectioned, schematic view of an electrodeless UV lamp and energy source according to the present invention.

The present invention is directed to a method for treating a photoresist composition comprising exposing the composition to radiation from an electrodeless UV lamp. In this manner, the photoresist is exposed to light, including but not limited to, light in the 100 to 450 nanometer ("nm") range. The exposure should be at a dosage sufficient to effect the treatment, as further discussed below. As noted above, the method finds application in the treatment of both positive and negative photoresists. "Treatment" in reference to a positive photoresist refers to exposure to UV radiation so as to effect depolymerization of the photoresist material, or increased solubilization of the resist. "Treating" in reference to a negative photoresist refers to exposure to UV radiation so as to effect crosslinking of the photoresist material, or decreasing the solubility of the resist. Thus, treating or treatment generally refers to effecting a difference in solubility between the portion of the photoresist exposed to radiation and the portion of the photoresist not exposed to radiation.

Any suitable positive photoresist can be treated according to the present methods. Examples of suitable positive photoresist compounds are described, for example, in U.S. Pat. Nos. 6,100,008; 5,733,479; 5,721,088; 5,600,035; 5,489,714 and 5,449,834. Positive photoresists are available, for example, from PPG Industries, Inc., in their Liquid Image Plus™ and Electro Image Plus® lines. Similarly, any suitable negative photoresist can be used according to the present invention. Such compositions are described, for example, in U.S. Pat. Nos. 5,721,088 and 5,674,660. Negative photoresists are commercially available, for example, from Shipley Co., Marlboro, Mass. and Vantico, N.Y. U.S. Pat. No. 5,595,859 discloses a suitable electrodepositable photoresist composition. All of these patents and the references cited therein are hereby incorporated by reference.

Treatment of the photoresist is effected by exposure to UV radiation generated from an electrodeless UV lamp. These lamps are commercially available, for example, from Fusion UV Systems, Inc., Gaithersburg, Md., such as the lamps in their F600S UV lamp system line. Electrodeless UV lamps are also available from Primarc, a subsidiary of Nordson, Amherst, Ohio. In general, the gas inside the electrodeless bulb is excited by high frequency microwave energy emitted from a magnetron. Bulb ignition is achieved by a small low pressure mercury vapor lamp located behind a reflector. This radiates short-wave UV light, which ionizes the gas inside the microwave bulb. The bulb reaches full power within a few seconds, producing the output necessary for treating the photoresist. Bulbs are typically filled with mercury gas, either alone or in conjunction with a metal halide dopant. Examples include mercury indium, mercury gallium, and mercury iron bulbs. Metal halides without mercury can also be used in such lamps. The bulbs are commercially available in a variety of watts per inch (wpi), such as those ranging from 300 to 600 wpi. It will be appreciated that different commercially available bulbs have different wpi values at different wavelengths. A bulb can be selected so as to have the maximum wpi value at the desired wavelength or wavelength range.

Typically, when turning on a conventional UV lamp, an electrode attached to the bulb or a gas inside the bulb is burned up or consumed. This consumption eventually necessitates replacement of the bulbs. Because the electrodeless bulbs of the present invention are "turned on" by means of excitation, nothing is consumed that would shorten the life of the bulb; thus, the electrodeless UV bulbs do not wear out as quickly as other UV bulbs. This represents an advantage of the present invention.

FIG. 1 shows a suitable electrodeless UV lamp in partial cross-section, schematic form. With reference to FIG. 1, a microwave-excited electrodeless discharge lamp 2, is fitted inside housing 4 having reflector means 6. A wave guide 8 is attached to magnetron 10 supplied with power from the power supply 12. The magnetron 10 oscillates a microwave that is guided through wave guide 8 and into housing 4, forming a strong microwave magnetic field in housing 4. By this strong microwave magnetic field, the gas in the electrodeless discharged lamp 2 is excited, so as to radiate ultraviolet light as depicted by the arrows in FIG. 1.

UV radiation emanating from lamp 2 can be directed towards the photoresist composition to be treated. This is typically done by the reflector means 6. It will be appreciated that a number of different reflectors and a variety of configurations can be used to direct the UV radiation to the photoresist. Different reflector configurations and lamps are described, for example, in U.S. Pat. Nos. 6,118,130; 5,962,860 and 5,832,362. Although those patents discuss different applications with different objectives, the concepts of directing the radiation would be relevant here. Depending on the needs and desires of the user, the apparatus taught in these patents, or modifications thereof, could be useful for carrying out the present methods.

It will be appreciated that UV light is in the range of approximately 100 to 450 nm. The wavelengths above about 315 nm are especially suitable for treating photoresists.

According to the present invention, it would be desirable to expose the photoresist to an array of wavelengths in the UV range, particularly the 320 to 380 nm range, and there would be no desire to filter out any of the wavelengths in this range. The "D" UV electrodeless bulb commercially available from Fusion UV Systems is particularly well suited for delivering UV light in the 320 to 380 nm range. It will be appreciated, however, that certain substrates will be covered with, for example, glass and/or Mylar during exposure to the UV radiation and as a result radiation below about 320 nm or 280 nm, depending on the material(s) used, may be filtered out. Exposure to the wavelengths of 320 nm and above, however, will not be impeded. Thus, exposure to wavelengths between about 280 and 450 or about 320 and 450 are particularly relevant to many applications of the current methods.

The dosage at which treatment of the photoresist is effected can vary depending on the particular photoresist used, the thickness of the photoresist, and the substrate to which the photoresist is applied. "Dosage" or "photo speed" refers to the amount of actinic radiation required to effect treatment of the photoresist film. Photo speed or dosage is typically expressed in millijoules per centimeter$^2$ (mJ/cm$^2$). Suitable dosages when treating a photoresist of between about 0.2 and 0.3 mils are typically about 400 mJ/cm$^2$ +/−25%, or about 400 mJ/cm$^2$ +/−10%, as measured with a Model 87 digital radiometer, Standard Probe 320–380, commercially obtained from EIS, Tukwila, Wash. It will be appreciated that dosages measured with equipment from other manufacturers—even with digital radiometers using the same type of probe—can be significantly different than the values achieved with the EIS product. It will be further appreciated that the dosage given above is that to which the photoresist itself is exposed. As noted above, artwork or masks made of Mylar or other materials will absorb some of the UV radiation, as will print frames made of glass or glass and plastic. These factors should be accounted for when determining how to administer the appropriate dosage. Thickness of the photoresist should also be considered, as a thicker coating will typically require a higher dosage of radiation. The appropriate dosage to use for a given application will be readily apparent to those skilled in the art.

The dosage needed to effect treatment results from administration of a particular intensity of light for a particular length of time. A dosage of about 400 mJ/cm$^2$ as described can be achieved, for example, by exposure of the photoresist to UV radiation at an intensity of approximately 80 milliwatts per centimeter$^2$ ("mW/cm$^2$") for five seconds, or an intensity of 40 mW/cm$^2$ for ten seconds. A similar dosage would be achieved by administering approximately 50 mW/cm$^2$ for about eight seconds. Because it is often desired to minimize the amount of time in which treatment is effected, the intensity will generally be high enough to deliver the necessary dosage in the desired time, such as about five seconds or even less.

It will further be appreciated that the distance between the light and the photoresist is related to the intensity, as set forth in The Inverse Square law: intensity is inversely proportional to (distance of light)$^2$. Thus, the distance at which the electrodeless UV lamp is placed in relation to the photoresist composition should be taken into account when calculating the desired dosage and intensity. The distance between the UV lamp and the photoresist composition should be close enough to effect relatively quick treatment (i.e. about five seconds or less) but not so close to cause heat damage.

It will be appreciated that the parameters discussed above will vary depending on the photoresist being used, its thickness, and the application. Generally, the photoresist composition should be uniformly exposed to the UV radiation.

The photoresist can be applied to any suitable substrate. Examples include wood, paper, particle board, chipboard, metals, metals having primers, glass, plastics, and metallized plastics. The coated substrates have a variety of applications, such as in the chemical milling industry, lead frame manufacturing, manufacture of aperture screens, the printing plate industry and especially the circuit board industry. The photoresist can be applied to the substrate by any known means, such as brushing, dipping, roll coating, doctor blade coating, spraying, curtain coating, and electrodeposition. Such methods are standard practice in the various arts in which the photoresists find application.

The present invention is further directed to an apparatus for making a circuit board. The apparatus generally comprises an electrodeless UV lamp, means for directing radiant energy from the lamp to the photoresist, and means for affixing a mask to the photoresist. The UV lamp and reflecting means can be as described above. The means for affixing a mask to a photoresist can be those means standardly used in the circuit board art for this purpose. Typically, this is an apparatus in which the substrate comprising photoresist on either or both sides is placed between a mask on one side or masks on both sides. The substrate/mask(s) are placed in a print frame having windows of glass, Mylar, plastic and the like. A vacuum is applied to the print frame, thereby drawing the mask(s) into intimate contact with the photoresist. The vacuum is maintained during exposure to actinic radiation. Placement and maintenance of the mask(s) in the formation of circuit boards typically requires great precision or resolution, which cannot be achieved with current apparatus in which electrodeless UV light is used.

Typically, the apparatus will further comprise a support means that holds the substrate on which the photoresist is deposited during exposure to the radiant energy. Because the application of radiant energy should be uniform, and because the speed at which treatment is effected is often important, it is further desirable that either the support means, the UV lamp, or both, be moveable. For example, the support means can be a movable means, while the UV lamp is stationary relative to the support means. Alternatively, the support means can be stationary and the UV lamp can move relative to the support, such as by scanning. Alternatively, both the support means and UV light can move. In any embodiment, according to the invention, rapid and uniform exposure to UV radiation can be achieved.

It is further possible for the present apparatus to employ a plurality of UV lamps positioned at various angles relative to the substrate. In this manner, uniformity of UV exposure can be further ensured. UV lamps can also be positioned both above and below the substrate so that the photoresist composition on either side of a substrate can be treated. Use of lamps both above and below the substrate are particularly relevant in the preparation of circuit boards, which are typically treated on both sides.

Figure 2:
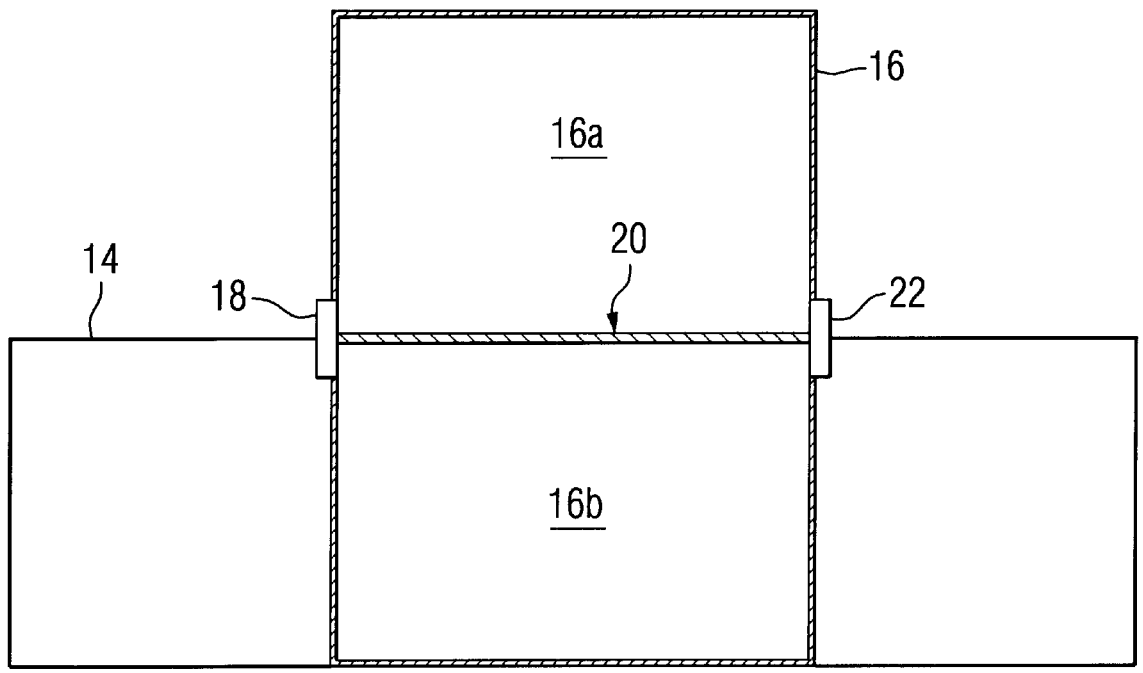
FIG. 2 is a schematic view of an apparatus according to one embodiment of the present invention.

FIG. 2 depicts one embodiment of an apparatus according to the present invention. The mask is affixed to the substrate using vacuum means 14. The vacuumed print frame passed into housing 16 through inlet 18. Support means 20 holds the print frame while in housing 16. Housing 16 contains at least one electrodeless UV lamp (not shown) and means for directing radiation from the lamp to the photoresist (not shown). More than one lamp can be used within housing 16 such as one or more lamps above 16a or below 16b support means 20. The exposed photoresist exits the housing 16 at outlet 22. The apparatus, it will be appreciated, can be fully automated.

The present invention is therefore further directed to methods for making a circuit board. The methods generally comprise the steps of applying a photoresist to an electroconductive substrate; applying a mask over the photoresist; treating the photoresist with radiation from one or more electrodeless UV lamps at a dosage sufficient to effect the treatment of the photoresist; and developing the photoresist.

Application of the photoresist to the circuit board can be by any means known in the art, such as those means listed above for the application of a photoresist to a substrate. Particularly suitable for the preparation of circuit boards are roll coating and electrocoating. The electroconductive substrate can be any metallic surface such as stainless steel, nickel, beryllium, copper, copper alloys, or mixtures thereof.

Following application of the photoresist to a suitable substrate, a piece of artwork or a mask is overlaid on the circuit board. The mask prevents the penetration of UV radiation to certain portions of the photoresist. For positive photoresists the mask covers that which is to be retained on the circuit board, and for a negative photoresists the mask covers that which is to be eliminated from the circuit board. Typically, the mask is overlaid on the photoresist and vacuumed to the board between a print frame, that is two pieces of glass, plastic or the like, as described above.

The vacuumed print frame can then be treated with radiation from one or more electrodeless UV lamps. The dose should be sufficient to effect treating of the photoresist. The parameters discussed above regarding dosage and related factors are applicable to the present methods for making circuit boards. Because different radiometers can give very divergent dosage readings, the circuit board industry has established the Stouffer Step Tablet ("SST") for standardization purposes. SST is a 21-step gray scale that will provide image quality results that can be compared regardless of the developer used, the radiometer used, etc. For positive photoresists, a clear value of about 5 or less is typically desired, while for negative photoresists, a solid value of greater than 8 is typically desired. The present methods achieve these parameters. The clear value represents the density of photoresist that is "cleared away" after exposure to UV radiation and developing solution. The solid value that remains represents the exposure level for a negative photoresist.

After irradiation and removal of the photomask, the photoresist film is developed. Development of the photoresist film entails subjecting it to a developing solution by spraying, dipping, or the like. Any developing solution known in the art can be used. For example, a basic aqueous solution can be used for polymeric materials, such as KOH, NaOH, $K_2CO_3$ and $Na_2CO_3$ solutions.

Usually, the photoresist film is developed at a temperature between 0 and 180° F. over a period of between about ten seconds and ten minutes. The concentration of the base in the developing solution can be between about 0.05 and 20 weight percent in water. The exposed areas of a negative photoresist become insolubilized, i.e. less soluble to a developing solution. The opposite is true for a positive photoresist. Thus, there is a solubility differential between the exposed and unexposed areas of the photoresist film, and the developing solution removes one or the other.

For a negative photoresist, the unexposed areas of the film are removed. After the development, the portion of the substrate that is not covered by the photoresist is etched to form a circuit. Etching involves the removal of the conductive substrate that is not covered with the photoresist film. Etching is typically conducted by subjecting the uncovered substrates to an etchant comprising, for example, ferric chloride solutions, cupric chloride, alkaline ammonical etchants or peroxide in sulfuric acid. The etchant is usually sprayed onto the developed surfaces. The etchant is usually at a temperature of between about 0 and 150° F., and remains on the surface of the substrate for a time sufficient to remove exposed copper metal, typically between about 1 and 20 minutes. After etching, stripping means known in the art are employed to remove the remaining photoresist film from the circuit board. Stripping is typically conducted by placing the etched substrate in the stripping solution at a temperature of between about 20 and 212° F. for a period of between about ten seconds to ten minutes.

The methods for making circuit boards according to the present invention can be carried out by using the apparatus described above.

As used herein, unless otherwise expressly specified, all numbers such as those expressing values, ranges, amounts or percentages may be read as if prefaced by the word "about", even if the term does not expressly appear. Also, as used herein, the term "polymer" is meant to refer to oligomers and both homopolymers and copolymers.

EXAMPLES

The following examples are intended to illustrate the invention, and should not be construed as limiting the invention in any way.

Example 1

This example was run to confirm that treatment of photoresists, particularly positive photoresists, can be effected in times of less than 5 seconds. The lamp used in the testing was commercially obtained from Fusion UV; the Fusion F-600 "D" bulb, which contains iron-doped mercury, and "H" bulb, which is pure mercury were used. As discussed below, use of the "D" bulb allowed adequate exposure times in 1 to 3 seconds. The light was placed in a holder over top of a conveyor. The holder was adjustable in the "z" direction; the distance between the light and the conveyor surface was varied as indicated on the table below. Dosage was recorded both with the Power Puck™, a radiometer commercially obtained through UV Process Supply, Inc., and the EIS Digital Radiometer, Model 87, discussed above.

The substrates tested according to the present invention were copper substrates that had been wire bar coated with Liquid-Image™ to a thickness of between approximately 0.2 and 0.3 mils. The Stouffer Step Tablet and piece of test artwork were laid on the coated substrate. Duplicate panels were exposed to each of the two bulbs at four different heights. The coated substrates were passed under the bulbs on conveyors, at speeds that correlated to an exposure time of approximately 2 seconds or less. The different variables for each panel and the results obtained for each panel are provided in the table below. Panels were exposed to UV radiation both with and without artwork. When no artwork was used, a Mylar film was laid on the photoresist to account for the UV radiation that would normally be absorbed by artwork made from this material. Following exposure, the panels were developed in a spray developer in a 1.5 percent NaOH solution at 150° F. Not all of the panels were developed.

Control values were obtained using a high pressure mercury capillary electrode lamp applying the dosage and time indicated in Table 1.

TABLE 1

| | | | | | | Dosage Readings | |
| --- | --- | --- | --- | --- | --- | --- | --- |
| Panel | Expose Conditions | Clear Time | Total Time | Clear SST | Clear Time w/no A/W | Power Puck (mJ/cm$^2$) | EIS Meter |
| 1 | "H", 5" D, 10 ft/min, ~2 sec | 50–55" | 110" | 4.0 | 25" | A 1513<br>B 1280<br>C 191<br>V 1165 | 159 mJ/cm$^2$ |
| 3 | "H", 5" D, 20 ft/min, ~1 sec | 55" | 110" | 3.0 | 25" | A 786<br>B 665<br>C 100<br>V 609 | 159 mJ/cm$^2$ |
| 5 | "H", 10" D, 20 ft/min, ~1 sec | 105" | 210" | 6.0 | 45" | A 458<br>B 396<br>C 59<br>V 356 | 98 mJ/cm2 |
| 7 | "H", 10" D, 10 ft/min, ~2 sec | 55" | 110" | 3.0 | 35" | A 875<br>B 752<br>C 114<br>V 678 | 197 mJ/cm$^2$ |
| 10 | "H", 14.5" D, 10 ft/min, ~2 sec | 75" | 150" | 4.0 | 40" | A 716<br>B 608<br>C 96<br>V 548 | 149 mJ/cm$^2$ |
| 11 | "H", 14.5" D, 6 ft/min, ~3 sec | 50" | 100" | 3.0 | 30" | A 1178<br>B 996<br>C 158<br>V 901 | 354 mJ/cm$^2$ |

TABLE 1-continued

| | | | | | | Dosage Readings | |
|---|---|---|---|---|---|---|---|
| Panel | Expose Conditions | Clear Time | Total Time | Clear SST | Clear Time w/no A/W | Power Puck (mJ/cm$^2$) | EIS Meter |
| 13 | "D", 5" D, 20 ft/min, ~1 sec | 30" | 60" | 4.0 | 20" | A 2427<br>B 777<br>C 77<br>V 1460 | 324 mJ/cm$^2$ |
| 15 | "D", 5" D, 40 ft/min, ~0.5 sec | 45" | 90" | 3.0 | 30" | A 1118<br>B 354<br>C 35<br>V 668 | 140 mJ/cm$^2$ |
| 17 | "D", 10" D, 20 ft/min, ~1.0 sec | 35" | 70" | 3.5 | 23" | A 1488<br>B 469<br>C 45<br>V 877 | 283 mJ/cm$^2$ |
| 19 | "D", 10" D, 10 ft/min, ~2.0 sec | 20" | 40" | 4.0 | 12" | A 2847<br>B 883<br>C 82<br>V 1669 | 560 mJ/cm$^2$ |
| 22 | "D", 10" D, 40 ft/min, ~0.5 sec | 65" | 130" | 3.0 | 30" | A 716<br>B 225<br>C 21<br>V 421 | 145 mJ/cm$^2$ |
| 23 | "D", 14.5" D, 10 ft/min, ~2.0 sec | 25" | 50" | 3.0 | 15" | A 2071<br>B 640<br>C 60<br>V 1223 | 402 mJ/cm$^2$ |
| 25 | "D", 14.5" D, 20 ft/min, ~1.0 sec | 45" | 90" | 3.0 | 25" | A 1022<br>B 315<br>C 29<br>V 603 | 204 mJ/cm$^2$ |
| 27 | "D", 14.5" D, 40 ft/min, ~0.5 sec | 100" | 200" | 4.5 | 45" | A 511<br>B 157<br>C 14<br>V 301 | 102 mJ/cm$^2$ |
| 29 | "D", 14.5" D, 78 ft/min, ~0.25 sec | 150" | 270"-<br>film gone | | 90" | A<br>B<br>C<br>V | 94 mJ/cm$^2$ |
| 31 | "D", 2.5" D, 105 ft/min | 90" | 180" | 4.5 | 45" | | |
| 34 | "D", 2.5" D, 47 ft/min | 40" | 80" | 3.0 | 25 | | |
| Control 1 | 30" ORC | 60" | 120" | 3.5 | 30" | | |
| Control 2 | ~350 mJ (1'21") w/vacuum, ORC-Lab | 30" | 60" | 3.0 | 18" | | |
| Control 3 | ~200 mJ (51") w/vacuum, ORC-Lab | 45" | 90" | 3.0 | 30" | | |

As can be seen from the above table, the D lamp was the most effective. Particularly good results were achieved with Panel 19, which was exposed to light from the "D" bulb at a distance of 10 inches for approximately 2 seconds. The clear time, or time it takes for the positive photoresist to be washed off, was achieved in 20 seconds when artwork was used and 12 seconds with no artwork. A developing time of 10–15 seconds without artwork or 20–30 seconds with artwork is typically seen using conventional methods; the clear times when using the present methods compare with those when using conventional means, which confirms that complete exposure was achieved when using the present methods.

Table 1 provides values for clear time, which will be appreciated as the time it took the UV exposed positive photoresist to be removed from the substrate either with or without artwork; "total time" is two times the clear time. "Clear SST" is the results of the Stouffer Step Tablet. All values were obtained by visualization. Table 1 also provides dosage readings as determined by the Power Puck and in EIS model 87 digital radiometer. It will be appreciated that the dosage of value as measured by each radiometer are quite different, thus illustrating the point that different radiometers give very different readings.

Example 2

This example further illustrates the methods for treating a positive photoresist according to the present invention. Photoresist coated substrates as used in Example 1 were also used here, as was the "D" UV bulb, commercially obtained from Fusion UV Systems. The substrates were contained within a vacuum print tray. Lamp distance from the vacuum print tray was varied from 11 inches to 30 inches, as indicated in the tables below. The lamp unit was also evaluated at several angles in addition to the normal 90° or vertical position. Measurements were gathered using a grid superimposed on the glass of the vacuum print tray to confirm the uniformity of the pattern of exposure. In some cases, five panels were used at once and aligned as indicated in the tables. Exposure times of between 5 and 10 seconds were used. The UV exposed panels were developed using a 1.5 percent NaOH solution at 105° F. The EIS model 87 radiometer equipped with a standard 320–380 nm probe and a four UV band radiometer UV Power Puck™ were used to determine dosage.

Tables 2–8 showing results using various parameters. Looking to Table 7, for example, a rapid development (i.e. a 15 to 11 second clear time) was demonstrated using the current methods. Photoresist films of between about 0.20 and 0.30 mils were exposed and developed quickly in the 1.5 percent NaOH solution at 105° F. and had less than 30 seconds of UV exposure and 60 seconds or less develop time (30 seconds or less clear time). The 0.20 mil samples exposed for 5 seconds had a 15 second clear time (30 second total develop time to a 3.0 SST). The 0.2 mil, 10 second exposure sample had an 11 second clear time (22 second total develop time to a 3.0 SST). The 0.30 mil samples exposed for 5 seconds had a 28 second clear time (56 second total develop time to a 3.0 SST), and the 0.30 mil samples with 10 second exposure had an 18 second clear time (36 second total develop time to a 3.0 SST). This confirms that rapid results with high precision can be achieved using the present methods.

TABLE 2

Set up with one F-600 "D" Bulb centered over a 36" × 24" effective print area, as indicated by "X"
Lamp height - 30"
Dosages in 30 seconds.
Nos. given in mJ/cm2/mW/cm2
Note: lamp slightly out of level by approx. 5 degrees, thus left side readings are higher.

| Back/left | 36"/24" | 30"/21" |  | 6"/21" | 0"/24" | Back/right |
|---|---|---|---|---|---|---|
| EIS | 187/5.8 | 397/12.3 |  | 211/6.7 | 140/4.6 | EIS |
| A | 843/30 | 1725/60 |  | 924/32 | 649/23 | A |
| B | 236/8 | 498/16 |  | 273/9 | 190/6 | B |
| C | 2/1 | 53/2 |  | 9/1 | 0/0 | C |
| V | 472/17 | 980/34 |  | 946/18 | 325/12 | V |
| EIS |  |  |  |  |  | EIS |
| A |  |  |  |  |  | A |
| B |  |  |  |  |  | B |
| C |  |  |  |  |  | C |
| V |  |  |  |  |  | V |
| EIS |  |  |  |  |  | EIS |
| A |  |  |  |  |  | A |
| B |  |  | X |  |  | B |
| C |  |  |  |  |  | C |
| V |  |  |  |  |  | V |
| EIS |  |  | 389/13 |  |  | EIS |
| A |  |  | 1919/66 |  |  | A |
| B |  |  | 542/19 |  |  | B |
| C |  |  | 57/2 |  |  | C |
| V |  |  | 1144/40 |  |  | V |
| EIS |  |  |  |  |  | EIS |
| A |  |  |  |  |  | A |
| B |  |  |  |  |  | B |
| C |  |  |  |  |  | C |
| V |  |  |  |  |  | V |
| EIS | 180/5.7 | 377/12.2 |  | 228/6.9 | 159/5.3 | EIS |
| A | 786/26 | 1524/53 |  | 839/31 | 645/23 | A |
| B | 230/7 | 448/15 |  | 253/9 | 184/6 | B |
| C | 0/0 | 47/1 |  | 3/1 | 0/0 | C |
| V | 428/15 | 870/31 |  | 442/17 | 342/13 | V |
| Front/left | 36"/0" | 30"/3" | 18"/12" | 6"/3" | 0"/0" | Front/right |

TABLE 3

Initial testing Set up with one F-600 "D" Bulb centered over a 36" × 24" effective print area, as indicated in grid
Lamp height - 15"
Dosages in 10 seconds.
Nos. given in mJ/cm²/mW/cm²
Note: lamp leveled

| Back/left | 36"/24" | 30"/21" |  |  | 6"/21" | 0"/24" | Back/right |
|---|---|---|---|---|---|---|---|
| EIS |  | 71/6.2 | Panel 18-1 |  | 59/5.6 |  | EIS |
| A |  | 271/28 | exposed at |  | 232/23 |  | A |
| B |  | 94/9 | this position |  | 76/7 |  | B |
| C |  | 2/0 | < ------- |  | 0/0 |  | C |
| V |  | 129 14 |  |  | 126/14 |  | V |
| EIS |  |  |  |  |  |  | EIS |
| A |  |  |  |  |  |  | A |
| B |  |  |  |  |  |  | B |
| C |  |  |  |  |  |  | C |
| V |  |  |  |  |  |  | V |
| EIS |  |  |  |  |  |  | EIS |
| A |  |  | Above | Under |  |  | A |
| B |  |  | Glass & AW | Glass & AW |  |  | B |
| C |  |  |  |  |  |  | C |
| V |  |  |  |  |  |  | V |

TABLE 3-continued

| | | | | | | | | | |
|---|---|---|---|---|---|---|---|---|---|
| EIS | | | Panel 18-2 | 526/50.1 | | 288/31.8 | | | EIS |
| A | | | exposed at | 2879/273 | | | | | A |
| B | | | this position | 904/81 | | | | | B |
| C | | | -----> | 103/9 | | | | | C |
| V | | | | 1686/164 | | | | | V |
| EIS | | | | | | | | | EIS |
| A | | | | | | | | | A |
| B | | | | | | | | | B |
| C | | | | | | | | | C |
| V | | | | | | | | | V |
| EIS | | 52/5.5 | | | | | 52/5 | | EIS |
| A | | 232/28 | | | | | 243/6 | | A |
| B | | 72/8 | | | | | 72/7 | | B |
| C | | 0/0 | | | | | 0/0 | | C |
| V | | 109/15 | | | | | 133/16 | | V |
| Front/left | 36"/0" | 30"/3" | | | 18"/12" | | 6"/3" | 0"/0" | Front/right |

| Panel No. | Exposure Time | Develop Clear Time | Total Dev. Time | Clear SST |
|---|---|---|---|---|
| 18-1 | 10 sec. | 120 sec. | 240 sec. | 100% UFL |
| 18-2 | 10 sec. | 25 sec. | 50 sec. | 3 |

TABLE 4

Initial testing Set up with one F-600 "D" Bulb at right side aiming toward the center of the 36" × 24" effective print area, as indicated by "X"
Lamp height - 15" at 45° angle from right edge.
Dosages in 30 seconds.
Nos. given in $mJ/cm^2$ / $mW/cm^2$
Note: lamp centered front-to-back, distance from edge of lamp to panel center is 23".

| | | | | | | | | | | |
|---|---|---|---|---|---|---|---|---|---|---|
| Back/left | 36"/24" | 30"/21" | 24"/24" | 20"/24" | 16"/24" | 8"/24" | 4"/24" | 0"/24" | Back/right | |
| EIS | | | | 245/7.6 | 393/12.5 | 444/14.5 | 177/5.4 | | EIS | |
| A | | | | 1312/46 | 2032/71 | 2356/83 | 927/31 | | A | |
| B | | | | 367/13 | 557/19 | 669/22 | 255/8 | | B | |
| C | | | | 39/1 | 57/2 | 61/2 | 4/1 | | C | |
| V | | | | 733/26 | 1134/40 | 1196/42 | 514/18 | | V | |
| EIS | | | | | | | | | EIS | |
| A | | | | | | | | | A | |
| B | | | | | | | | | B | |
| C | | | | | | | | | C | |
| V | | | | | | | | | V | |
| EIS | | | | | | | | | EIS | |
| A | | | | | | | | | A | |
| B | | | | | | | | | B | X |
| C | | | | | | | | | C | |
| V | | | | 20"/12" | 16"/12" | 8"/12" | 4"/12" | 0"/12" | V | |
| EIS | | | | 351/11.1 | 573/18.5 | 760/25 | 322/10.3 | 11/0.2 | EIS | |
| A | | | | 1538/55 | 2455/86 | 3683/128 | 1608/55 | | A | |
| B | | | | 461/16 | 723/26 | 1064/35 | 456/15 | | B | |
| C | | | | 45/1 | 77/3 | 101/3 | 48/1 | | C | |
| V | | | | 819/29 | 1378/49 | 2001/71 | 932/32 | | V | |
| EIS | | | | | | | | | EIS | |
| A | | | | | | | | | A | |
| B | | | | | | | | | B | |
| C | | | | | | | | | C | |
| V | | | | | | | | | V | |
| EIS | | | 199/6 | 273/8.6 | 416/12.8 | 457/14.5 | 183/5.6 | | EIS | |
| A | | | 910/31 | 1337/45 | 1965/68 | 2247/78 | 956/33 | | A | |
| B | | | 267/9 | 386/13 | 554/19 | 621/21 | 267/9 | | B | |
| C | | | 5/1 | 38/1 | 52/2 | 64/2 | 14/1 | | C | |
| V | | | 500/18 | 736/26 | 1065/37 | 1336/46 | 544/19 | | V | |
| Front/left | 36"/0" | 30"/3" | 24"/0" | 20"/0" | 16"/0" | 8"/0" | 4"/0" | 0"/0" | Front/right | |

TABLE 5

Initial testing Set up with one F-600 "D" Bulb at right side aiming toward the center of the 36" × 24" effective print area, as indicated by "X"
Lamp height - 15" at 45° angle from right edge.
Dosages in 30 seconds.
Nos. given in $mJ/cm^2/mW/cm^2$
Note: lamp centered front-to-back, distance from edge of lamp to panel center is 21".
Exposed Panels for 30 sec. Arranged at  1,  2
                                            3
                                         4,  5

| Back/left | 36"/24" | 30"/21" | 24"/24" | 20"/24" | 16"/24" | 12"/24" | 8"/24" | 4"/24" | 0"/24" | Back/right |
|---|---|---|---|---|---|---|---|---|---|---|
| EIS |  |  |  | 226/7.3 | 453/~12 |  | 545/17.1 |  | 159/4.8 | EIS |
| A |  |  |  | 1382/47 | 2822/97 |  | 3585/122 |  | 966/33 | A |
| B |  |  |  | 357/12 | 783/28 |  | 1004/34 |  | 267/9 | B |
| C |  |  |  | 39/1 | 81/3 |  | 89/3 |  | 8/1 | C |
| V |  |  |  | 815/28 | 1617/56 |  | 1861/64 |  | 541/19 | V |
| EIS |  |  |  |  |  |  |  |  |  | EIS |
| A |  |  |  |  |  |  |  |  |  | A |
| B |  |  |  |  |  |  |  |  |  | B |
| C |  |  |  |  |  |  |  |  |  | C |
| V |  |  |  |  |  |  |  |  |  | V |
| EIS |  |  |  |  |  |  |  |  |  | EIS |
| A |  |  |  |  |  |  |  |  |  | A |
| B |  |  |  |  |  |  |  |  |  | B    X |
| C |  |  |  |  |  |  |  |  |  | C |
| V |  |  |  | 20"/12" | 16"/12" | 12"/12" | 8"/12" | 4"/12" | 0"/12" | V |
| EIS |  |  |  | 311/9.9 | 846/27 |  | 1082/37.5 |  | 341/10.8 | EIS |
| A |  |  |  | 1460/29 | 3807/129 |  | 5458/190 |  | 1767/61 | A |
| B |  |  |  | 407/13 | 1168/40 |  | 1591/54 |  | 494/16 | B |
| C |  |  |  | 46/1 | 105/4 |  | 168/6 |  | 51/1 | C |
| V |  |  |  | 880/30 | 1987/69 |  | 3448/122 |  | 1062/37 | V |
| EIS |  |  |  |  |  |  |  |  |  | EIS |
| A |  |  |  |  |  |  |  |  |  | A |
| B |  |  |  |  |  |  |  |  |  | B |
| C |  |  |  |  |  |  |  |  |  | C |
| V |  |  |  |  |  |  |  |  |  | V |
| EIS |  |  |  | 270/8.5 | 603/19.6 |  | 712/23.4 |  | 189/6.1 | EIS |
| A |  |  |  | 1337/46 | 3235/111 |  | 3966/137 |  | 1139/40 | A |
| B |  |  |  | 382/13 | 940/33 |  | 1091/37 |  | 313/11 | B |
| C |  |  |  | 35/1 | 84/3 |  | 114/4 |  | 31/1 | C |
| V |  |  |  | 699/24 | 1737/60 |  | 2485/87 |  | 671/25 | V |
| Front/left | 36"/0" | 30"/3" | 24"/0" | 20"/0" | 16"/0" | 12"/0" | 8"/0" | 4"/0" | 0"/0" | Front/right |

| Panel No. | Exposure Time | Develop Clear Time | Total Dev. Time | Clear SST |
|---|---|---|---|---|
| 1 | 30 sec. | 35 sec. | 70 sec. | 3 |
| 2 | 30 sec. | 75 sec. | 150 sec. | 3.5 |
| 3 | 30 sec. | 11 sec. | 22 sec. | 3 |
| 4 | 30 sec. | 30 sec. | 60 sec. | 3– |
| 5 | 30 sec. | 65 sec. | 130 sec. | 3 |

TABLE 6

Initial testing Set up with one F-600 "D" Bulb at right side aiming toward the center of the 36" × 24" effective print area, as indicated by "X"
Lamp height - 15" at 15° angle from 4" in from right edge.
Dosages in 30 seconds.
Nos. given in $mJ/cm^2/mW/cm^2$
Note: lamp centered front-to-back, distance from edge of lamp to panel center is 17.5".
Exposed Panels for 30 sec. Arranged at  6,  7
                                            8
                                         9,  10            X

| Back/left | 36"/24" | 24"/24" | 20"/24" | 16"/24" | 12"/24" | 8"/24" | 4"/24" | 0"/24" | Back/right |
|---|---|---|---|---|---|---|---|---|---|
| EIS |  |  | 211/6.7 | 513/16.5 |  | 563/17.8 |  | 133/4.1 | EIS |
| A |  |  | 1164/39 | 3066/104 |  | 3817/130 |  | 786/28 | A |
| B |  |  | 327/11 | 844/29 |  | 1046/36 |  | 219/7 | B |
| C |  |  | 35/1 | 92/3 |  | 89/3 |  | 0/1 | C |
| V |  |  | 681/24 | 1909/66 |  | 1957/69 |  | 445/16 | V |
| EIS |  |  |  |  |  |  |  |  | EIS |
| A |  |  |  |  |  |  |  |  | A |
| B |  |  |  |  |  |  |  |  | B |
| C |  |  |  |  |  |  |  |  | C |
| V |  |  |  |  |  |  |  |  | V |
| EIS |  |  |  |  |  |  |  |  | EIS |
| A |  |  |  |  |  |  |  |  | A |

TABLE 6-continued

| | | | | | | | | |
|---|---|---|---|---|---|---|---|---|
| B | | | | | | | | B |
| C | | | | | | | | C |
| V | 20"/12" | 16"/12" | 12"/12" | 8"/12" | 4"/12" | 0"/12" | | V |
| EIS | 356/12 | 1015/33 | | 1305/44.2 | | 276/9.7 | | EIS |
| A | 1725/60 | 5373/179 | | 7180/253 | | 1382/51 | | A |
| B | 494/16 | 1620/53 | | 2018/68 | | 404/14 | | B |
| C | 52/2 | 138/5 | | 175/6 | | 45/1 | | C |
| V | 976/34 | 2711/93 | | 3815/135 | | 812/30 | | V |
| EIS | | | | | | | | EIS |
| A | | | | | | | | A |
| B | | | | | | | | B |
| C | | | | | | | | C |
| V | | | | | | | | V |
| EIS | 266/8.4 | 654/21.7 | | 777/25.4 | | 184/5.7 | | EIS |
| A | 1393/48 | 3662/128 | | 4156/143 | | 973/33 | | A |
| B | 396/13 | 1021/34 | | 1121/38 | | 271/9 | | B |
| C | 38/1 | 87/3 | | 123/4 | | 19/1 | | C |
| V | 791/28 | 1888/67 | | 2756/97 | | 555/20 | | V |
| Front/left 36"/0" | 24"/0" | 20"/0" | 16"/0" | 12"/0" | 8"/0" | 4"/0" | 0"/0" | Front/right |

| Panel No. | Exposure Time | Develop Clear Time | Total Dev. Time | Clear SST |
|---|---|---|---|---|
| 6 | 30 sec. | 45 sec. | 90 sec. | 3 |
| 7 | 30 sec. | 75 sec. | 150 sec. | 4 |
| 8 | 30 sec. | 7 sec. | 14 sec. | 3 |
| 9 | 30 sec. | 55 sec. | 110 sec. | 3 |
| 10 | 30 sec. | 35 sec. | 70 sec. | 3 |

TABLE 7

Initial testing Set up with one F-600 "D" Bulb centered over a 36" × 24" effective print area
Lamp height - 15" at parallel from in from table.
Dosages in 15 seconds.
Nos. given in $mJ/cm^2/mW/cm^2$
Note: lamp centered front-to-back

| Back/left | 36"/24" | 24"/24" | 20"/24" | 16"/24" | 12"/24" | 4"/24" | 0"/24" | Back/right |
|---|---|---|---|---|---|---|---|---|
| EIS | | | | | | | | EIS |
| A | | | | | | | | A |
| B | | | | | | | | B |
| C | | | | | | | | C |
| V | | | | | | | | V |
| EIS | | | | | | | | EIS |
| A | | | | | | | | A |
| B | | | | | | | | B |
| C | | | | | | | | C |
| V | | | | | | | | V |
| EIS | | | | | | | | EIS |
| A | | | | | | | | A |
| B | | | | | | | | B |
| C | | | | | | | | C |
| V | | | 18"/12" | 14"/12" | 12"/12" | 4"/12" | 0"/12" | V |
| EIS | | | 1160/75 | 566/38 | 339/22.5 | | | EIS |
| A | | | 7402/477 | 3203/212 | 1781/124 | | | A |
| B | | | 2182/144 | 954/59 | 538/36 | | | B |
| C | | | 231/15 | 85/5 | 54/3 | | | C |
| V | | | 4350/291 | 1624/110 | 1004/73 | | | V |
| EIS | | 18"/4" ---- > | 877/51 | 393/27 | 277/18 | < --- 12"/4" | | EIS |
| A | | | 4163/284 | 2215/150 | 1305/84 | | | A |
| B | | | 1329/94 | 696/44 | 411/25 | | | B |
| C | | | 136/10 | 60/4 | 39/2 | | | C |
| V | | | 2378/170 | 1100/78 | 719/48 | | | D |
| EIS | | | 558/35 | 298/18.7 | 184/12 | | | EIS |
| A | | | 2374/160 | 1220/81 | 772/51 | | | A |
| B | | | 781/55 | 392/25 | 246/16 | | | B |
| C | | | 77/5 | 33/2 | 23/1 | | | C |
| V | | | 1347/91 | 603/42 | 438/30 | | | V |
| Front/left 36"/0" | 24"/0" | 20"/0" | 18"/0" | 14"/0" | 12"/0" | 8"/0" | 4"/0" 0"/0" | Front/right |

Additional Measurements at Parallel in center directly beneath lamp.

| Lamp Height | Exposure Time | APM mJ/cm2 | A | B | C | V | Develop Clear Time | 2x Dev. Time | Clear SST |
|---|---|---|---|---|---|---|---|---|---|
| 15" | 15 sec. | 1092 | 7261/463 | 2107/139 | 218/14 | 4264/283 | 9 sec. | 18 sec. | 3.5 |
| 15" | 10 sec. | 574 | 4311/449 | 1318/138 | 144/14 | 2461/274 | 11 sec. | 22 sec. | 3 |
| 15" | 5 sec. | 329 | 2572/452 | 844/139 | 100/14 | 1408/253 | 15 sec. | 30 sec. | 3 |

TABLE 7-continued

| | | | | | | | | | |
|---|---|---|---|---|---|---|---|---|---|
| 20" | 15 sec. | 615 | 4167/264 | 1224/80 | 129/9 | 2461/164 | 15 sec. | 30 sec. | 3 |
| 20" | 10 sec. | 387 | 2826/262 | 848/80 | 92/8 | 1638/162 | 23 sec. | 46 sec. | 3 |
| 20" | 5 sec. | 213 | 1591/262 | 517/80 | 61/8 | 880/150 | 50 sec. | 100 sec. | 3 |
| 15" | 15 sec. | Electro-Image Exposure to be developed at PPG | | | | | | | |
| 15" | 10 sec. | Electro-Image Exposure to be developed at PPG | | | | | | | |
| 15" | 10 sec. | Electro-Image Exposure to be developed at PPG | | | | | | | |
| 15" | 5 sec. | Electro-Image Exposure to be developed at PPG | | | | | | | |
| 15" | 15 sec. | 22 bar Coating, DFT - 0.3 mil. | | | | | 13 sec. | 26 sec. | 3 |
| 15" | 10 sec. | 22 bar Coating, DFT - 0.3 mil. | | | | | 18 sec. | 36 sec. | 3 |
| 15" | 5 sec. | 22 bar Coating, DFT - 0.3 mil. | | | | | 28 sec. | 56 sec. | 3 |
| 20" | 15 sec. | 22 bar Coating, DFT - 0.3 mil. | | | | | 24 sec. | 48 sec. | 3 |
| 20" | 15 sec. | 22 bar Coating, DFT - 0.3 mil. | | | | | 35 sec. | 70 sec. | 3 |
| 20" | 15 sec. | 22 bar Coating, DFT - 0.3 mil. | | | | | 75 sec. | 150 sec. | 3+ |

TABLE 8

Initial testing Set up with one F-600 "D" Bulb centered over a 36" × 24" effective print area
Lamp height - 11" at parallel from in from table.
Dosages in 15 seconds.
Nos. given in mJ/cm²/mW/cm²
Note: lamp centered front-to-back

| | EIS | mJ/cm2/mW/cm2 | | | |
|---|---|---|---|---|---|
| | | A | B | C | V |
| Center Reading at 5 sec. = | 710 mJ | 5204/822 | 1699/253 | 200/26 | 2893/474 |
| Center Reading at 10 sec. = | 1106 mJ | 8193/822 | 2515/255 | 276/27 | 4703/506 |

| Back/left | 36"/24" | 24"/24" | 20"/24" | 16"/24" | | 12"/24" | | 4"/24" | 0"/24" | Back/right |
|---|---|---|---|---|---|---|---|---|---|---|
| EIS | | | | | | | | | | EIS |
| A | | | | | | | | | | A |
| B | | | | | | | | | | B |
| C | | | | | | | | | | C |
| V | | | | | | | | | | V |
| EIS | | | | | | | | | | EIS |
| A | | | | | | | | | | A |
| B | | | | | | | | | | B |
| C | | | | | | | | | | C |
| V | | | | | | | | | | V |
| EIS | | | | | | | | | | EIS |
| A | | | | | | | | | | A |
| B | | | | | | | | | | B |
| C | | | | | | | | | | C |
| V | | | | 18"/12" | 14"/12" | 12"/12" | | 4"/12" | 0"/12" | V |
| EIS | | | | 1884/123 | 656/43 | 403/27 | | | | EIS |
| A | | | | 13160/849 | 4092/265 | 2434/173 | | | | A |
| B | | | | 3856/256 | 1231/77 | 735/50 | | | | B |
| C | | | | 403/27 | 119/7 | 59/3 | | | | C |
| V | | | | 7771/516 | 2221/150 | 1148/85 | | | | V |
| EIS | | | 18"/4"---→ | 1192/78 | 385/27 | 290/20 | ←--12"/4" | | | EIS |
| A | | | | 5525/363 | 1757/122 | 1245/90 | | | | A |
| B | | | | 1809/127 | 579/38 | 402/27 | | | | B |
| C | | | | 178/12 | 52/3 | 31/2 | | | | C |
| V | | | | 3143/211 | 963/69 | 592/45 | | | | V |
| EIS | | | | 635/39 | 238/14.2 | 173/11.2 | | | | EIS |
| A | | | | 2402/168 | 908/57 | 656/44 | | | | A |
| B | | | | 792/59 | 292/19 | 209/13 | | | | B |
| C | | | | 76/6 | 26/1 | 16/1 | | | | C |
| V | | | | 1381/95 | 500/34 | 322/23 | | | | V |
| Front/left | 36"/0" | 24"/0" | 20"/0" | 18"/0" | 14"/0" | 12"/0" | 8"/0" | 4"/0" | 0"/0" | Front/right |

| Panel No. | Expose Time | Develop | Clear Time | 2x Dev Time | Clear SST | Comments |
|---|---|---|---|---|---|---|
| 1 | 5 sec. | 10 sec. | 20 sec. | | 3.5 | Both panels at the center point directly beneath the lamp. |
| 2 | 10 sec. | 7 sec. | 14 sec. | | 4 | |

Example 3

Substrates prepared as described above were subject to 5, 10 and 15 second exposure times using an F-600 "D" bulb centered over a 32"×24" effected print area. The lamp height was 15 inches and was parallel to the table surface. The results are provided in Table 9. As can be seen from the table, the exposure times and conditions gave very rapid clear times and desirable clear SST values.

TABLE 9

| Panel No. | Expose Time | Develop Clear Time | 2× Dev. Time | Clear SST |
|---|---|---|---|---|
| 1 | 5 sec. | 19" | 38" | 3 |
| 2 | 10 sec. | 11" | 22" | 3 |
| 3 | 15 sec. | 8" | 16" | 3+ |

Whereas particular embodiments of this invention have been described above for purposes of illustration, it will be evident to those skilled in the art that numerous variations of the details of the present invention may be made without departing from the invention as defined in the appended claims.

What is claimed is:

1. A method for treating a photoresist composition comprising exposing said composition to radiation from an electrodeless UV lamp comprising emissions in the 315 nm to 450 nm wavelength range at a dosage sufficient to effect said treating.

2. The method of claim 1, wherein said photoresist is a positive photoresist and treating results in increasing the solubility of the photoresist.

3. The method of claim 1, wherein said photoresist is a negative photoresist and treating results in decreasing the solubility of the photoresist.

4. The method of claim 1, wherein a mask is used over the photoresist to allow for radiation exposure in a predetermined pattern.

5. The method of claim 4, wherein the mask is affixed to the photoresist within a print frame by vacuum means.

6. The method of claim 1, wherein said dosage is effected by exposing said photoresist to radiation at an intensity of between 40 and 80 milliwatts per centimeter$^2$ for a period of between 5 and 10 seconds.

7. The method of claim 6, wherein an intensity of 80 milliwatts per centimeter$^2$ is employed for 5 seconds.

8. The method of claim 6, wherein an intensity of 50 milliwatts per centimeter$^2$ is employed for 8 seconds.

9. The method of claim 6, wherein an intensity of 40 milliwatts per centimeter$^2$ is employed for 10 seconds.

10. A method for making a circuit board comprising:

applying a photoresist to an electroconductive substrate;

applying a mask over the photoresist;

treating said photoresist with radiation from an electrodeless UV lamp comprising emissions in the 315 nm to 450 nm wavelength range at a dosage sufficient to effect said treating; and developing the photoresist.

11. The method of claim 10, wherein said photoresist is a positive photoresist.

12. The method of claim 11, wherein said dosage is sufficient to achieve a Stouffer Step Tablet clear value of 5 or less.

13. The method of claim 10, wherein said photoresist is a negative photoresist.

14. The method of claim 13, wherein said dosage is sufficient to achieve a Stouffer Step Tablet solid value of greater than 8.

* * * * *